US008921713B2

(12) United States Patent
Eriksson

(10) Patent No.: US 8,921,713 B2
(45) Date of Patent: Dec. 30, 2014

(54) AUXILIARY CONTACT BLOCK

(71) Applicant: Lars Eriksson, Vasteras (SE)

(72) Inventor: Lars Eriksson, Vasteras (SE)

(73) Assignee: ABB AB (SE)

( * ) Notice: Subject to any disclaimer, the term of this patent is extended or adjusted under 35 U.S.C. 154(b) by 0 days.

(21) Appl. No.: 14/267,253

(22) Filed: May 1, 2014

(65) Prior Publication Data

US 2014/0238830 A1 Aug. 28, 2014

Related U.S. Application Data

(63) Continuation of application No. PCT/EP2011/069322, filed on Nov. 3, 2011.

(51) Int. Cl.
*H05K 7/02* (2006.01)
*H01H 9/00* (2006.01)

(52) U.S. Cl.
CPC .................................. *H01H 9/0066* (2013.01)
USPC ............................ 174/541; 361/732; 439/717

(58) Field of Classification Search
USPC ............................ 174/541; 439/717; 361/732
See application file for complete search history.

(56) References Cited

U.S. PATENT DOCUMENTS

| | | | | |
|---|---|---|---|---|
| 4,591,228 | A * | 5/1986 | Vasseur | 439/715 |
| 4,729,744 | A * | 3/1988 | Bet et al. | 439/717 |
| 4,956,561 | A * | 9/1990 | Tamer | 307/10.1 |
| 5,029,270 | A * | 7/1991 | Shiraishi et al. | 174/50 |
| 5,590,027 | A * | 12/1996 | Provenzale | 361/732 |
| 5,743,768 | A * | 4/1998 | Hohorst et al. | 439/723 |
| 6,002,579 | A * | 12/1999 | Drexler et al. | 361/605 |
| 6,085,925 | A * | 7/2000 | Chung | 220/4.02 |
| 8,199,525 | B2 * | 6/2012 | Bohnen et al. | 361/801 |
| 8,752,269 | B2 * | 6/2014 | Chin et al. | 29/525.01 |
| 2004/0082214 | A1 * | 4/2004 | Lafragette et al. | 439/342 |
| 2005/0077069 | A1 * | 4/2005 | Quero et al. | 174/52.4 |
| 2009/0065248 | A1 * | 3/2009 | Finley et al. | 174/541 |

FOREIGN PATENT DOCUMENTS

| | | | |
|---|---|---|---|
| DE | 9114742 | U1 | 2/1992 |
| EP | 0831569 | A2 | 3/1998 |
| EP | 1662533 | A1 | 5/2006 |
| FR | 2588438 | A1 | 4/1987 |

OTHER PUBLICATIONS

International Preliminary Report on Patentability Application No. PCT/EP2011/069322 Completed: Sep. 30, 2013 19 pages.
International Search Report and Written Opinion of the International Searching Authority Application No. PCT/EP2011/069322 Completed: Jul. 18, 2012; Mailing Date: Jul. 24, 2012 11 pages.

* cited by examiner

*Primary Examiner* — Hung V Ngo
(74) *Attorney, Agent, or Firm* — St. Onge Steward Johnston & Reens LLC

(57) ABSTRACT

An auxiliary contact block for a low voltage contactor, wherein the contactor has a side wall including first and second recesses. The auxiliary contact block includes a first and a second housing, connected in parallel to each other, an actuation nipple extending out from the second housing, and a connecting mechanism for connecting the auxiliary contact block to the contactor. The connecting mechanism includes a snap-fit element for locking the auxiliary contact block to the contactor when it is at a latched position and being adapted to engage in the second recess provided on the side wall of the contactor, and a releasing member for unlocking the snap-fit element to an unlatched position and including a releasing bar arranged for receiving a pressing force. The releasing member is arranged on the second housing and further includes a wedge element connected to the pressing element.

4 Claims, 4 Drawing Sheets

AUXILIARY CONTACT BLOCK

FIELD OF THE INVENTION

The present invention relates to an auxiliary contact block for a low voltage contactor. The auxiliary contact block comprises a connecting mechanism for connecting the auxiliary contact block to the low voltage contactor, wherein a low voltage is commonly defined as up to about 1000V AC or 1500V DC.

BACKGROUND OF THE INVENTION

A contactor is an electrically controlled switch device used for switching an electric power or control circuit of an electrical load device. Such a contactor comprises a contacting unit, an actuating unit and an enclosure for housing the actuating unit and the contacting unit. The contacting unit includes a movable contact and a stationary contact, both are for carrying current when a contact is made between them. The actuating unit is for operating the movable contact for electrical connection or disconnection.

An auxiliary contact block may include a plurality of contacting units. An auxiliary contact block may be added to a contactor when additional contacts or additional functions are required, for example, to indicate an operation status of a contactor or, to use it as a safety purpose for two contactors to prevent them from being closed simultaneously, otherwise a short circuit occurs. To connect an auxiliary contact block to a contactor, an auxiliary contact block is traditionally secured by screws to the contactor. Therefore, tools are needed for making such a connection.

A patent EP0831569B discloses an auxiliary switch including a tool free connection mechanism. The auxiliary switch comprises an actuation nipple extending out from a first side-wall of the switch housing and for coupling to a movable switch element of an additional auxiliary switch or electromagnetic switch device. Two snap hooks or catches protrude out from the first side-wall of the switch housing and adjoin pressure pieces disposed on an opposite-facing narrow third side-walls, where the snap hooks is adapted to be engaged into recesses of a housing wall of a further auxiliary switch or switch device. The invention enables an operator to connect the auxiliary switch to a lateral wall of an additional auxiliary switch or electromagnetic switch device without using tools. However, when a connection is performed in a limited space, for example, in a cabinet, it might be difficult to reach the snap hooks in order to remove the auxiliary switch from the electromagnetic switch device, because this needs spaces in both sides of the auxiliary switch.

SUMMARY OF THE INVENTION

One object of the present invention is to provide an auxiliary contact block with an improved connecting mechanism for connecting or disconnecting the auxiliary contact block to a contactor.

This object is achieved by an auxiliary contact block, characterized in that the releasing member is attached on the second housing and further comprises a wedge element connected to the pressing element. An inlet is provided on the second housing for receiving the wedge element. The snap-fit element is attached on the first housing and protrudes out from the inlet. The wedge element is arranged, upon pressing the releasing bar, an latched snap-fit element is pushed aside to the unlatched position so that the auxiliary contact block is unlocked from the contact device.

This structure enables easy attachment to or detachment from a contactor. The attachment comprises simply hooking and pushing operations, whereas the detachment includes pushing and unhooking operations. A tool is not required in either attachment or detachment of the auxiliary contact block.

Preferably, the releasing member is attached on the top edge of the first housing. This means that the inlet is also arranged on the top edges of the second housing in order to engage a releasing operation.

According to one embodiment of the invention, the auxiliary contact block may further comprise a stopping block attached on the second housing and adjacent to the snap-fit element so that the snap-fit element will not be pushed further when releasing auxiliary contact block from the contactor.

Preferably a second set of snap-fit element, releasing member, inlet and stopping block is provided on the same housing as the first corresponding one and situated at a distance from the first corresponding one. Having the second set of snap-fit element, releasing member, inlet and a second stopping block enables a stable connection between the auxiliary contact block and the contactor. To be easily operated, the first and second releasing members may preferably be arranged in such a distance so that a detachment action may be operated by just one thumb or finger.

Furthermore, the auxiliary contact block may further comprise a connecting hook attached on the second housing for engaging with the first recess provided on the side wall of the contactor. The connecting hook may be arranged with a distance to the releasing member.

BRIEF DESCRIPTION OF THE DRAWINGS

The invention will now be explained more closely by the description of different embodiments of the invention and with reference to the appended figures.

DETAILED DESCRIPTION OF THE INVENTION

Figure 1:
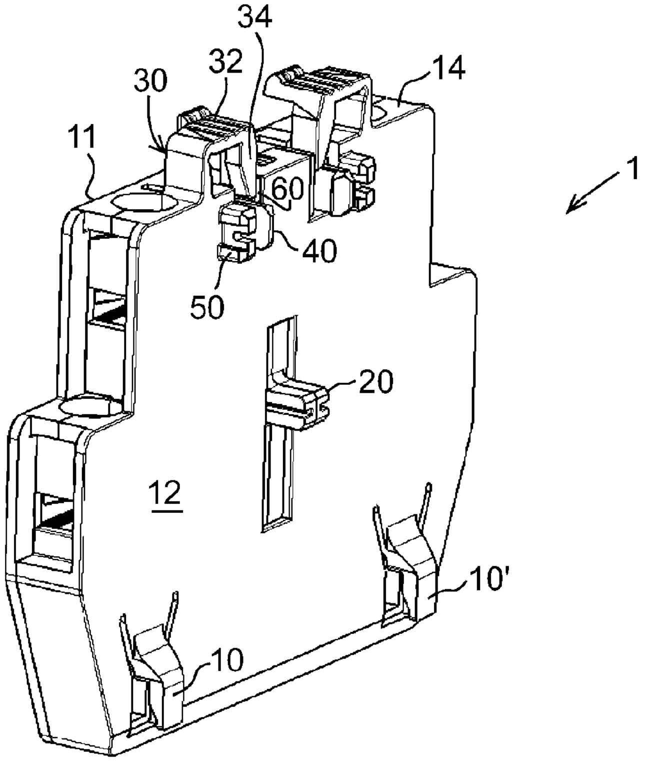
FIG. 1 shows a perspective view of an auxiliary contact block to be connected to a low-voltage contactor, according to one embodiment of the invention.
Figure 2:
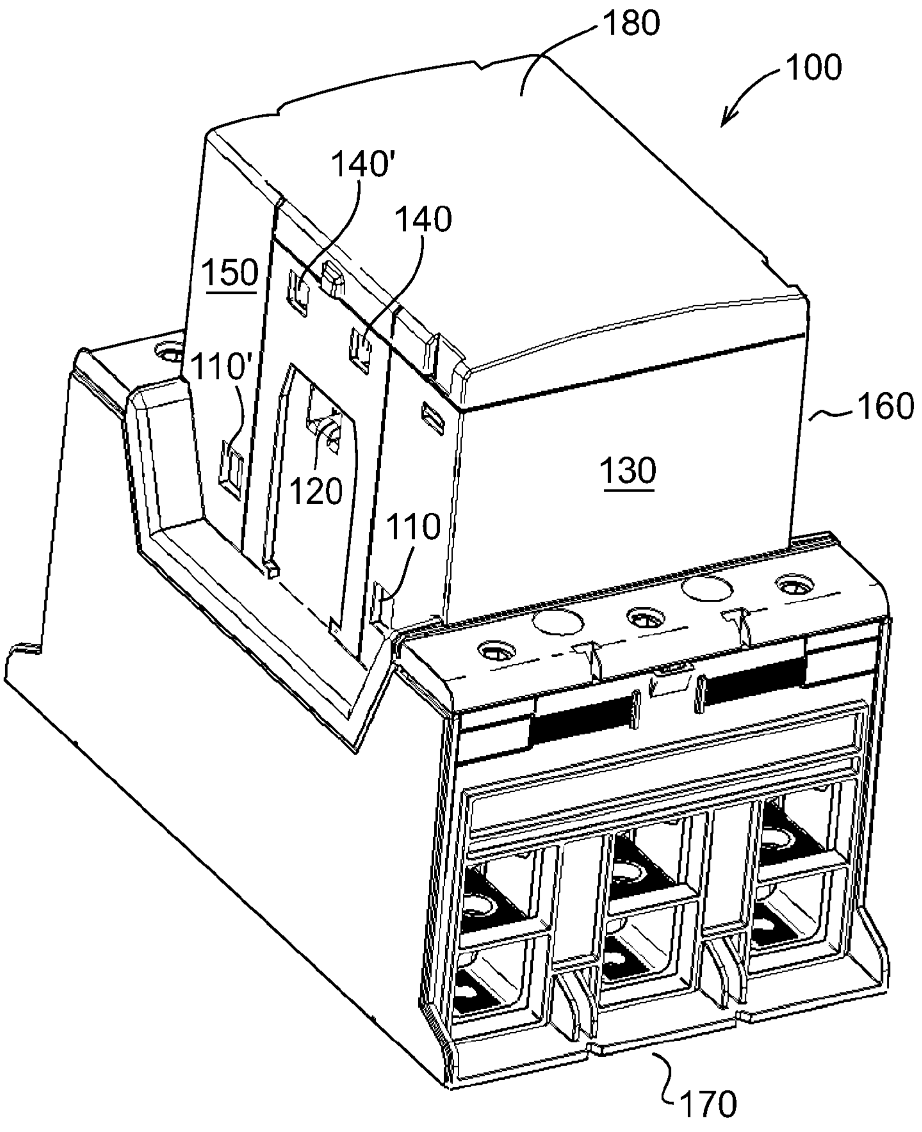
FIG. 2 is a perspective view of the low-voltage contactor to which the auxiliary contact block is to be connected.

FIG. 2 shows a low-voltage contactor 100 to which the auxiliary contact block shown in FIG. 1 is to be connected. Such a contactor is used in the industry for controlling an electric power or control circuit of an electrical device such as a motor, a lighting unit, a heating apparatus or a capacitor bank. Contactor 100 may comprise top 180, front 130, back (not visible), right and left sides 150, 160 and base 170 respectively. The contactor 100 further comprises a movable contact and a stationary contact part (they not visible) and, an actuating unit (not visible) for operating the movable contact part to make (dis)connection with the stationary contact part. On the right and/or left side, first 110 and second 140 recesses are provided.

Figure 1A:
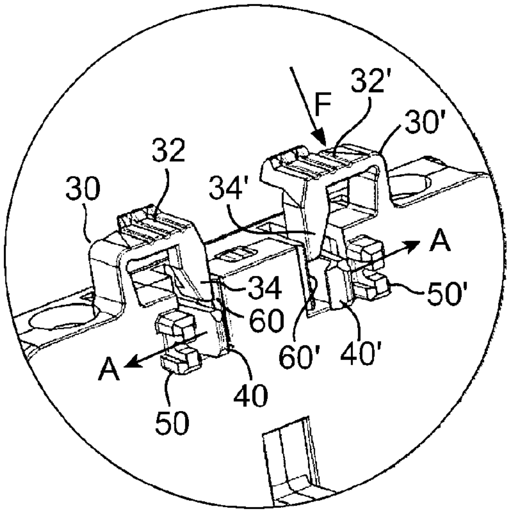
FIG. 1*a* shows a partial inner side perspective view of the connecting mechanism of the auxiliary contact block shown in FIG. 1.
Figure 1B:
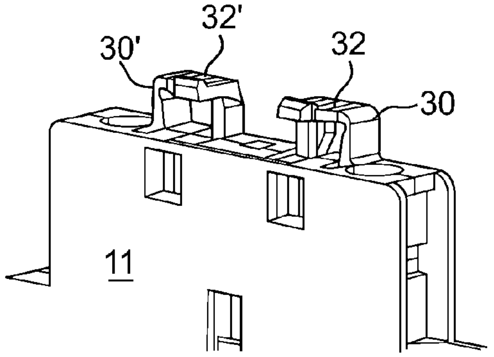
FIG. 1*b* shows a partial outer side perspective view of the connecting mechanism of an auxiliary contact block shown in FIG. 1.

FIG. 1, FIG. 1*a* and FIG. 1*b* show a perspective view, a partial inner perspective view and a partial outer perspective view of an auxiliary contact block 1 to be connected to a low-voltage contactor 100, according to one embodiment of the invention.

An auxiliary contact block 1 comprises a first 11 and second 12 housings connected in parallel to each other, an actuation nipple 20 extending out from the second housing 12, and a connecting mechanism for connecting the auxiliary contact block to a contact device. The actuation nipple 20 is adapted to be connected to the actuating unit of a contactor. The connecting mechanism comprising a snap-fit element 40 for locking the auxiliary contact block to the contact device when it is at a latched position and a releasing member 30 for unlocking the snap-fit element 40 to an unlatched position.

In this example, the releasing member 30 is disposed on the top edge 14 of the second housing 12 and comprises a pressing element 32 and a wedge 34 connected to the pressing bar. The pressing element is in the form of a bar and arranged for receiving a pressing force. An inlet 60 is provided on the top edge of the second housing 12 for receiving the wedge element 34 when it is pressed. Preferably, the inlet 60 is arranged adjacent to the releasing member 30.

The snap-fit element 40 is attached on the first housing 11 and has a cantilever with its one end protruding out from the inlet 60 through the second housing. This end has a hook shape to be incorporated with the second recess 140 provided on the contactor.

It is advantageous that the releasing members are attached on the top edge of the second housing because this enables a releasing action when there is a limited space, for example when the contactor is arranged in a cabinet.

The auxiliary contact block may further comprise a connecting hook 10. In this example, the connecting hook is disposed close to the side opposite to the releasing member to be engaged with the first recess 110 provided on the right or left side of the contactor.

The first recess 110 is provided for engaging the connecting hook 10. The second recess 140 is provided for engaging the snap-fit element 40.

Figure 3A:
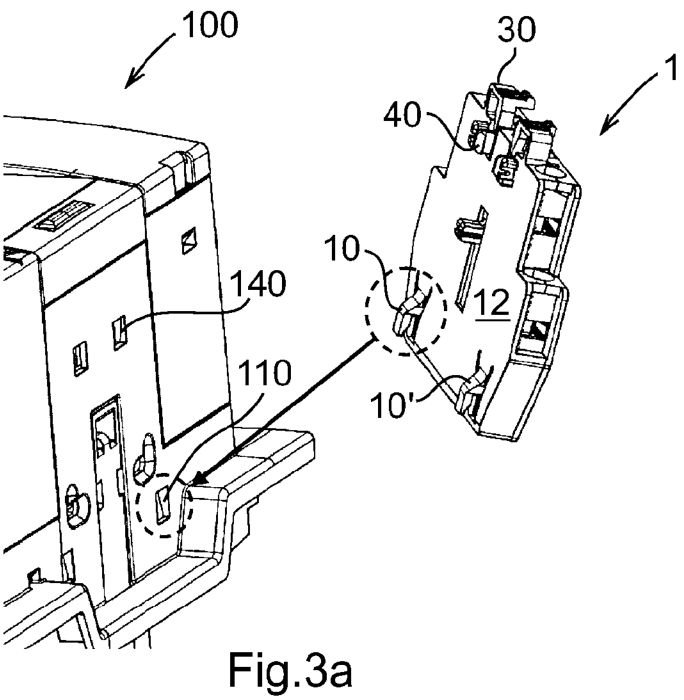
FIG. 3*a* is an exploded view of a contact block assembly comprising a contactor and an auxiliary contact block.
Figure 3B:
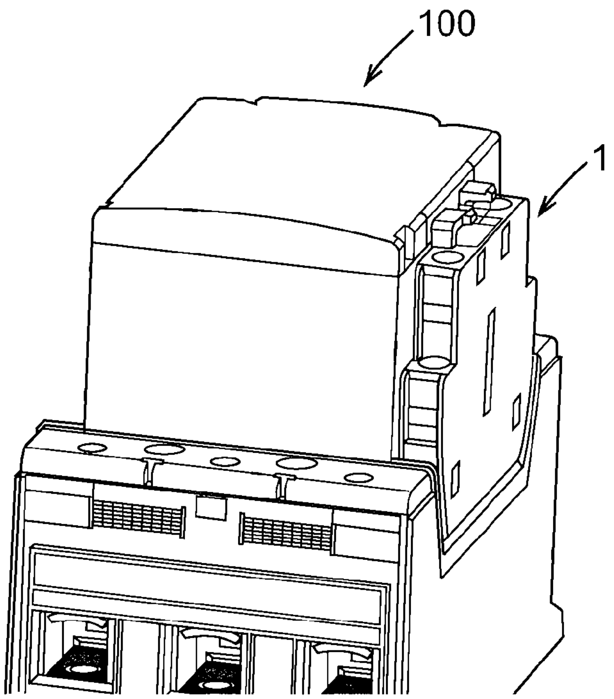
FIG. 3*b* is a perspective view of a contactor connected to an auxiliary contact block to form a contact block assembly.

With reference to FIG. 3*a* and FIG. 3*b*, the auxiliary contact block 1 may be attached or connected to either the right side or the left side of the contactor 100. To connect the auxiliary contact block 1 to the contact 100, one may simply hook the connecting hook 10 in the first recess 110 provided on the side wall of the contactor, then pushing the contact block 1 against the contactor so that the snap-fit element 40 is latched in the second recess 100 when it is engaged with the latter.

With reference to FIG. 1*a*, to release or disconnect the auxiliary contact block 1 from the contact 100, a force F is acting on the releasing bar 32. The wedge element 34 is arranged in such a way that, upon pressing the releasing bar 32, it is pressed into the inlet 60 so that it pushes the latched snap-fit element 40 aside to the unlatched position in the direction A and the auxiliary contact block is therefore unlocked from the contact device. Thereafter, it is easily to disconnect the contact block from the contactor by just unhooking the connecting hook 10 from the first recess 10. Preferably, a stopping block 50 is provided on the second housing 12 adjacent to the snap-fit element 40 to prevent the snap-fit element from being pushed further when a releasing action is performed.

The connection mechanism in the present invention is fully applicable to connect the auxiliary contact block to an additional auxiliary contact block as well.

Figures 4A, 4B, 4C:
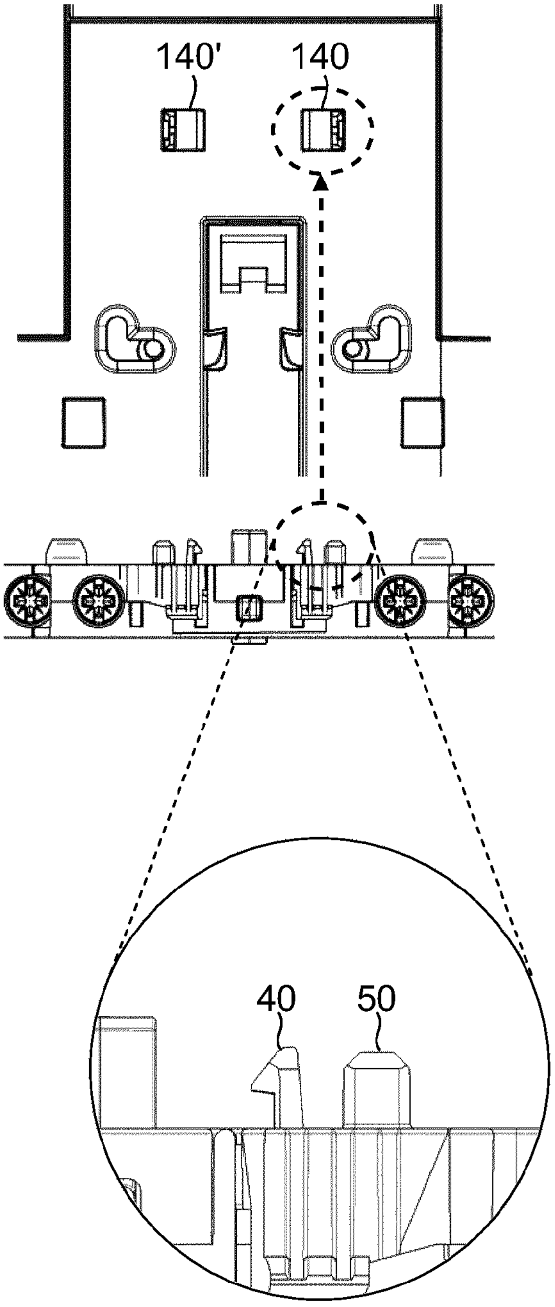
FIG. 4*a* is a top plan view of an embodiment of the auxiliary contact block of FIG. 1.
FIG. 4*b* is a back plan view of the contactor shown in FIG. 2.
FIG. 4*c* is an enlarged partial view of the snap-fit element and the stopping block shown in FIG. 4*a*.

FIG. 4*a*, FIG. 4*b* and FIG. 4*c* provide detailed views of the snap-fit element 40, the stopping block 10 and the second recess 140 provided on the contactor.

It should be understood that the invention is not limited to the above embodiment; it is also applicable to all possible designs that have modified or equivalent structures.

What is claimed is:

1. An auxiliary contact block for a low voltage contactor, wherein the contactor has a side wall including first and second recesses, the auxiliary contact block comprising a first and a second housing, connected in parallel to each other, wherein the second housing comprise a top edge and a bottom edge, an actuation nipple extending out from the second housing, and a connecting mechanism for connecting the auxiliary contact block to the contactor, the connecting mechanism comprising a snap-fit element for locking the auxiliary contact block to the contactor when it is at a latched position and being adapted to engage in the second recess provided on the side wall of the contactor, and a releasing member for unlocking the snap-fit element to an unlatched position and comprising a releasing bar arranged for receiving a pressing force, wherein when the auxiliary contact block is connected to the contactor, the bottom edge of the second housing being adjacent a part of the contactor, characterized in that the releasing member is attached on the second housing and further comprises a wedge element and a pressing element, wherein the wedge element is connected to the pressing element, an inlet is provided on the second housing for receiving the wedge element, the snap-fit element is attached on the first housing and protrudes out from the inlet, the wedge element is arranged, upon pressing the releasing bar, the latched snap-fit element is pushed aside to the unlatched position so that the auxiliary contact block is unlocked from the contactor and, the releasing member is attached on the top edge of the second housing.

2. The auxiliary contact block according to claim 1, further comprising a stopping block attached on the second housing and adjacent to the snap-fit element for preventing the snap-fit element from being pushed further when a releasing operation is perform.

3. The auxiliary contact block according to claim 1, wherein the connecting mechanism further comprises a second snap-fit element, a second releasing member, a second inlet and a second stopping block, wherein each of the second ones attached on the same housing as the first corresponding one and situate at a distance from the first corresponding one.

4. The auxiliary contact block according to claim 1, further comprising a connecting hook attached on the second housing to be engaged with the first recess provided on the side wall of the contactor.

* * * * *